United States Patent [19]
Sano et al.

[11] Patent Number: 5,965,328
[45] Date of Patent: Oct. 12, 1999

[54] RADIATION SENSITIVE RESIN COMPOSITION AND MATERIAL FOR FORMING BUMPS CONTAINING THE SAME

[75] Inventors: Kimiyasu Sano, Tsukuba; Hideki Chiba, Sagamihara; Katsutoshi Igarashi, Yokohama; Toshiyuki Ota, Tsukuba; Yoshiyuki Michino, Tsuchiura; Hozumi Sato, Tsukuba, all of Japan

[73] Assignee: JSR Corporation, Tokyo, Japan

[21] Appl. No.: 08/925,427

[22] Filed: Sep. 8, 1997

Related U.S. Application Data

[63] Continuation of application No. 08/644,152, May 10, 1996, abandoned.

[30] Foreign Application Priority Data

May 10, 1995 [JP] Japan ..................................... 7-136034

[51] Int. Cl.$^6$ ...................................................... G03F 7/40
[52] U.S. Cl. .......................... 430/315; 430/281.1; 430/910
[58] Field of Search ................................ 430/315, 281.1, 430/910

[56] References Cited

U.S. PATENT DOCUMENTS

| | | | |
|---|---|---|---|
| 3,645,772 | 2/1972 | Jones | 117/34 |
| 4,629,680 | 12/1986 | Iwasaki et al. | 430/910 X |
| 4,777,115 | 10/1988 | Koch et al. | 430/907 X |
| 5,419,998 | 5/1995 | Mayes et al. | 430/910 X |

FOREIGN PATENT DOCUMENTS

| | | | |
|---|---|---|---|
| 64-49035 | 2/1989 | Japan | 430/281 |

OTHER PUBLICATIONS

Kurisu, Insulation/Circuits, Sep. 1981, vol. 27, No. 10, pp. 107–111.

*Primary Examiner*—Cynthia Hamilton
*Attorney, Agent, or Firm*—Oblon, Spivak, McClelland, Maier & Neustadt, P.C.

[57] ABSTRACT

A radiation sensitive resin composition comprising:
(A) an alkali-soluble copolymer comprising:
   (a) 10 to 50% by weight of a first unit consisting of a radical polymerizable compound having a carboxylic group,
   (b) 20 to 60% by weight of a second unit consisting of a radical polymerizable compound having a cycloalkyl group, the unit containing no carboxyl group, and
   (c) 5 to 40% by weight of a third unit consisting of a radical polymerizable compound other than the radical polymerizable compounds in (a) and (b) above;
(B) a polymerizable compound having at least one ethylenically unsaturated double bond; and
(C) a radiation sensitive radical initiator. Also is disclosed a material for forming bumps containing the radiation sensitive resin composition. The radiation sensitive resin composition has sufficient developability with an alkali developer and sufficient resolution when the composition is in the form of a 20 $\mu$m or more thick film. The composition and material of the present invention have excellent resistance to plating liquids and good wettability to plating liquids, and improved adhesion to substrates upon development. Therefore, the composition and material of the present invention can form bumps having sufficient characteristics by plating and give rise to a cured product which has excellent peelability from the substrate on which it is formed.

4 Claims, No Drawings

RADIATION SENSITIVE RESIN COMPOSITION AND MATERIAL FOR FORMING BUMPS CONTAINING THE SAME

This application is a continuation of application Ser. No. 08/644,152, filed on May 10, 1996, now abandoned.

BACKGROUND OF THE INVENTION

1. Field of the Invention

The present invention relates generally to a radiation sensitive resin composition and to a material containing the composition for forming bumps. More particularly, the present invention relates to a radiation sensitive resin composition suitable for photofabrication of bumps when a circuit substrate is fabricated or when a semiconductor, an electronic component or the like is mounted on the circuit substrate as well as to a material containing such a radiation sensitive resin composition for forming bumps.

2. Description of the Related Art

Photofabrication is a generic name for a technology which fabricates various precision parts, the technology including coating a radiation sensitive resin composition on an article to be processed, patterning the coated film by photolithography, electroforming as by one or more of chemical etching, electrolytic etching or electroplating using the patterned film as a mask. The photofabrication is a technology which is leading the current precision microprocessing techniques.

Recently, down sizing of electronic apparatus and appliances is prevailing in accordance with which incessant change in the design of LSIs is on-going, that is, those LSIs which are more highly integrated or have more layers are fabricated. As a result, there is a demand for a multi-pin packaging method for mounting an LSI on a substrate in order to package the LSI on an electronic apparatus or appliance and attention has been focused on bare chip packaging such as a TAB method or a flip chip method. In such a multi-pin packaging method, it is necessary to arrange protruded electrodes of 20 $\mu$m in height which serve as connector terminals called "bump" on a substrate with high precision. In future, a further down-sizing of LSI will invoke a need for an increasingly high precision of bumps.

Materials for use in forming such a bump are required to meet various requirements. For example, the materials must be able to form a thick film as thick as 20 $\mu$m or more, must have enough adhesion to the substrate, must have sufficient resistance and wettability to plating liquids, and must be readily peeled with a peeling liquid after the plating is over.

Further, a film coated from the materials for use in forming such a bump must have a sufficient flexibility when the film is coated on a flexible substrate such as a polyimide film or the like. This is because no crack should occur in the resulting film even when the substrate is bent to some extent.

However, a resist, which is a conventional material for forming bumps, is insufficient in its adhesion to a substrate and wettability to plating liquids.

Accordingly, when the resist has poor adhesion to the substrate upon development, a problem occurs that use of finer pattern sizes of the resist for forming bumps causes a problem that the resist tends to come off the substrate more often.

In addition, another problem arises that when the material for forming bumps has a poor wettability to plating liquids, no uniform plating can be formed on the substrate.

SUMMARY OF THE INVENTION

An object of the present invention is to provide a radiation sensitive resin composition suitable for a material forming bumps.

Another object of the present invention is to provide a radiation sensitive resin composition which has a sufficient developability with an alkali developer and a sufficient resolution when it is in the form of a 20 $\mu$m or more thick film as well as a good wettability to plating liquids.

Still another object of the present invention is to provide a radiation sensitive resin composition which allows formation of good bumps by plating.

Yet another object of the present invention is to provide a radiation sensitive resin composition which can coat a film on a substrate that has excellent peelability and sufficient flexibility.

A further object of the present invention is to provide a material for forming bumps containing such a radiation sensitive resin composition.

According to a first aspect of the present invention, there is provided a radiation sensitive resin composition comprising:
(A) an alkali-soluble copolymer comprising:
  (a) 10 to 50% by weight of a first unit consisting of a radical polymerizable compound having a carboxylic group,
  (b) 20 to 60% by weight of a second unit consisting of a radical polymerizable compound having a cycloalkyl group, said unit containing no carboxyl group, and
  (c) 5 to 40% by weight of a third unit consisting of a radical polymerizable compound other than said radical polymerizable compounds in (a) and (b) above;
(B) a polymerizable compound having at least one ethylenically unsaturated double bond; and
(C) a radiation sensitive radical initiator.

Here, the radical polymerizable compound (c) above may contain a compound represented by formula (I) below:

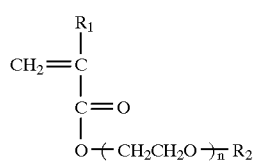

(I)

Alternatively, the radical polymerizable compound (c) above may contain a compound represented by formula (II) below:

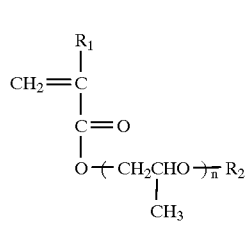

(II)

In a second aspect of the present invention, there is provided a bump forming material comprising a radiation sensitive resin composition, wherein said radiation sensitive resin composition comprises:
(A) an alkali-soluble copolymer comprising:
  (a) 10 to 50% by weight of a first unit consisting of a radical polymerizable compound having a carboxylic group,
  (b) 20 to 60% by weight of a second unit consisting of a radical polymerizable compound having a cycloalkyl group, said unit containing no carboxyl group, and (c) 5 to 40% by weight of a third unit consisting of a radical polymerizable compound other than said radical polymerizable compounds in (a) and (b) above;

(B) a polymerizable compound having at least one ethylenically unsaturated double bond; and (C) a radiation sensitive radical initiator.

The radiation sensitive resin composition of the present invention has sufficient developability with an alkali developer and sufficient resolution when the composition is in the form of a 20 µm or more thick film. The composition and material of the present invention have excellent resistance to plating liquids and good wettability to plating liquids, and improved adhesion to substrates upon development. Therefore, the composition and material of the present invention can form bumps having sufficient characteristics by plating and give rise to a cured product which has excellent peelability from the substrate on which it is formed.

Other and further objects, features and advantages of the present invention will become more apparent from the following description.

DETAILED DESCRIPTION OF THE INVENTION

Hereinafter, the radiation sensitive resin composition and material for forming bumps containing such according to the present invention are described in detail.

Radiation Sensitive Resin Composition Copolymer (A)

Copolymer (A) which can be used in the present invention is an alkali-soluble copolymer. Copolymer (A) having such an alkali solubility can be obtained, for example, by copolymerization of a first monomer having a substituent that can impart alkali solubility to a polymer with a second monomer which is copolymerizable with the first monomer.

The copolymer (A) can be prepared, particularly, by radical copolymerization, in a solvent, of (a) the above-described radical polymerizable compound having the substituent that can impart a resin with alkali solubility, (b) a radical polymerizable compound having an alkyl group, and optionally (c) another radical polymerizable compound.

As the substituent that can impart a resin with alkali solubility, there can be cited, for example, a hydroxyl group, a carboxyl group, a sulfonic acid group, and the like. Particularly preferred is a carboxyl group.

The copolymer (A) is preferably a copolymer which is obtained by radical polymerization, in a solvent, of:
(a) a radical polymerizable compound having a carboxyl group;
(b) a radical polymerizable compound having a cycloalkyl group but having no carboxyl group; and
(c) a radical polymerizable compound other than the radical polymerizable compounds (a) and (b).

(A-1) Radical Polymerizable Compound (a)

As the radical polymerizable compound having a carboxyl group (a), there can be used, for example, monocarboxylic acids such as acrylic acid, methacrylic acid, crotonic acid, and the like; dicarboxylic acids such as maleic acid, fumaric acid, citraconic acid, mesaconic acid, itaconic acid, and the like; (meth)acrylic acid derivatives that have both a carboxylic acid and an ester bond, such as 2-succinyloxyethyl (meth)acrylate, 2-maleoyloxyethyl (meth)acrylate, 2-phthaloyloxyethyl (meth)acrylate, 2-hexahydrophthaloyloxyethyl (meth)acrylate, and the like; etc. Here, the term "(meth)acrylate" denotes methacrylate and/or acrylate.

These compounds may be used singly or two or more of them can be used in combination in order to control the degree of alkali solubility of the resulting alkali-soluble resin.

Among them, methacrylic acid, 2-hexahydrophthaloyloxyethyl methacrylate are preferred. More preferred is a combination of these two compounds.

The unit (a), which consists of the radical polymerizable compound having a carboxyl group, can exist in the copolymer (A) in an amount of 10 to 50% by weight, preferably 20 to 40% by weight. If the amount of the unit (a) is below 10% by weight, the resulting copolymer is difficult to dissolve in an alkali developer so that after the development, some of the film remains and sometimes fails to give sufficient resolution. On the contrary, with above 50% by weight of the unit (a), the resulting copolymer tends to have too high a solubility in an alkali developer, resulting in that dissolution of exposed portions, i.e., a film decrease, occurs too much.

(A-2) Radical Polymerizable Compound (b)

As the radical polymerizable compound (b) having a cycloalkyl group but having no carboxyl group, there can be cited, for example, cyclohexyl (meth)acrylate, 2-methylcyclohexyl (meth)acrylate, dicyclopentanyloxyethyl (meth)acrylate, isobornyl (meth)acrylate, dicyclopentanyl (meth)acrylate, and the like.

These compounds may be used singly or two or more of them can be used in combination in order to control the degree of alkali solubility of the resulting alkali-soluble resin.

Among these compounds, dicyclopentanyl (meth)acrylate is preferred.

The unit (b), which consists of the radical polymerizable compound having a cycloalkyl group but having no carboxyl group, can exist in the copolymer (A) in an amount of 20 to 60% by weight, preferably 30 to 50% by weight. If the amount of the unit (b) is below 20% by weight, the resulting copolymer has insufficiently high molecular weight so that the radiation sensitive resin composition is difficult to form a coating film of 20 µm or more in thickness. On the contrary, with above 60% by weight of the unit (b), the resulting copolymer tends to have a decreased solubility in solvents.

(A-3) Radical Polymerizable Compound (c)

The radical polymerizable compound (c) is used mainly for the purpose of controlling the mechanical properties of the copolymer (A) to desirable ones.

As the radical polymerizable compound (c), there can be cited, preferably, alkyl (meth)acrylates, aryl (meth)acrylates, dicarboxylic acid diesters, aromatic vinyls, conjugated diolefins, nitrile group-containing polymerizable compounds, chlorine-containing polymerizable compounds, amido bond-containing polymerizable compounds, fatty acid vinyl esters, and the like.

Specific examples of the radical polymerizable compound (c) include alkyl (meth)acrylates such as methyl methacrylate, ethyl methacrylate, n-butyl (meth)acrylate, sec-butyl (meth)acrylate, tert-butyl (meth)acrylate, isopropyl (meth)acrylate, and the like; aryl (meth)acrylates such as phenyl (meth)acrylate, benzyl (meth)acrylate, and the like; dicarboxylic acid diesters such as diethyl maleate, diethyl fumarate, diethyl itaconate, and the like; aromatic vinyls such as styrene, α-methylstyrene, m-methylstyrene, p-methylstyrene, vinyltoluene, p-methoxystyrene, and the like; conjugated diolefins such as 1,3-butadiene, isoprene, 1,4-dimethylbutadiene, and the like; nitrile group-containing polymerizable compounds such as acrylonitrile, methacrylonitrile, and the like; chlorine-containing polymerizable compound such as vinyl chloride, vinylidene chloride, and the like; amido bond-containing polymerizable compounds such as acrylamide, methacrylamide, and the like; fatty acid vinyl esters such as vinyl acetate and the like; etc.

These compounds may be used singly or two or more of them can be used in combination. Among them, particularly preferred are styrene, 1,3-butadiene, isoprene, methyl methacrylate, n-butyl acrylate, and the like.

When it is contemplated to form a coated film on a flexible substrate such as a polyimide film, it is necessary to impart flexibility to the film itself. In order to render a coated film flexible, it is advantageous to use compounds represented by general formulae (I) and (II) below, respectively:

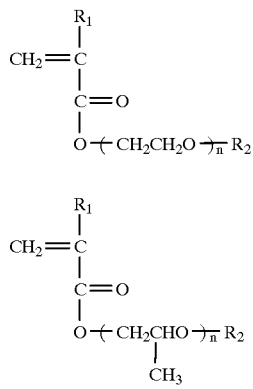

In the general formulae (I) and (II) above, $R_1$ is a hydrogen atom or a methyl group; $R_2$ is a hydrogen atom or a $C_1$-$C_4$ alkyl group, more specifically, a methyl group, an ethyl group, a n-propyl group, a n-butyl group, a tert-butyl group, etc., preferably, a methyl group. The symbol n is an integer not smaller than 2 and not larger than 25 ($2 \leq n \leq 25$).

Specific examples of the compound represented by the general formula (I) include methoxydiethylene glycol (meth)acrylate (n=2), ethoxydiethylene glycol (meth)acrylate (n=2), methoxytriethylene glycol (meth)acrylate (n=3), methoxytetraethylene glycol (meth)acrylate (n=4), methoxynonaethylene glycol (meth)acrylate (n=9), and the like, preferably methoxytriethylene glycol (meth)acrylate (n=3) and methoxytetraethylene glycol (meth)acrylate (n=4).

Specific examples of the compounds represented by the general formula (II) include methoxydipropylene glycol (meth)acrylate (n=2), methoxytripropylene glycol (meth) acrylate (n=3), methoxytetrapropylene glycol (meth) acrylate (n=4), and the like, preferably methoxydipropylene glycol (meth)acrylate (n=2).

These compounds may be used singly or two or more of them can be used in combination.

The unit (c), which consists of the radical polymerizable compound other than the radical polymerizable compounds (a) and (b) above, can exist in the copolymer (A) in an amount of 5 to 40% by weight, preferably 10 to 35% by weight. If the amount of the unit (c) is outside the above-described range, it is difficult to control mechanical properties of the resulting copolymer to desirable ones.

As the polymerization solvent which can be used in preparing the copolymer (A), there can be cited, for example, alcohols such as methanol, ethanol, ethylene glycol, diethylene glycol, propylene glycol, and the like; cyclic ethers such as tetrahydrofuran, dioxane, and the like; alkyl ethers of polyols such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, propylene glycol monoethyl ether, and the like; alkyl ether acetates of polyols such as ethylene glycol ethyl ether acetate, diethylene glycol ethyl ether acetate, propylene glycol methyl ether acetate, and the like; aromatic hydrocarbons such as toluene, xylene, and the like; ketones such as acetone, methyl ethyl ketone, methyl isobutyl ketone, 2-heptanone, cyclohexanone, 4-hydroxy-4-methyl-2-pentanone, diacetone alcohol, and the like; esters such as ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methyl-butanoate, methyl 3-methoxypropionate, ethyl 3-methoxypropionate, ethyl 3-ethoxypropionate, methyl 3-ethoxypropionate, and the like; etc.

Among these, cyclic ethers, alkyl ethers of polyols, alkyl ether acetates of polyols, ketones, esters, and the like are preferred.

As the polymerization catalyst used in the radical copolymerization, there can be employed conventional radical polymerization initiators, for example, azo compounds such as 2,2'-azobisisobutyronitrile, 2,2'-azobis(2,4-dimethylvaleronitrile), 2,21-azobis(4-methoxy-2,4-dimethylvaleronitrile), and the like; organic peroxides such as benzoyl peroxide, lauroyl peroxide, tert-butyl peroxypivalate, 1,1'-bis(tert-butylperoxy)cyclohexane, and the like; hydrogen peroxide; etc.

When peroxides are used as the radical polymerization initiator, they can be combined with a reducing agent so that they can be employed as a redox type initiator.

The copolymer (A) used in the present invention may preferably have a standard polystyrene-reduced weight average molecular weight (hereafter, referred to as "Mw") of 5,000 to 50,000, and more preferably 10,000 to 30,000. If Mw is not smaller than 5,000 the copolymer (A) has a sufficient film strength as a coated film and Mw of not higher than 50,000 gives rise to no extraordinary film unevenness upon coating and enables formation of a uniform coating.

Polymerizable Compound (B)

The polymerizable compound (B) which constitutes the radiation sensitive resin composition of the present invention is a compound which can polymerize thermally or photopolymerize. As the polymerizable compound (B), there can be cited, for example, (meth)acrylates having at least one ethylenically unsaturated double bond, bis(meth) acrylates, which have two ethylenically unsaturated double bonds, tris(meth)acrylates, which have three ethylenically unsaturated bonds, poly(meth)acrylates, which have 4 or more ethylenically unsaturated double bonds, and the like.

More specifically, the following compounds are cited as the polymerizable compound (B).

(1) Compounds having at least one ethylenically unsaturated double bond:

As the compound having at least one ethylenically unsaturated double bond can be employed the same compounds as the radical polymerizable compounds used in the radical polymerization for preparing the copolymer (A).

Among these compounds, there can be advantageously used mono(meth)acrylate compounds represented by general formula (III):

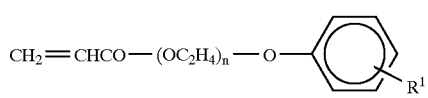
(III)

wherein $R^1$ is a hydrogen atom or a $C_1$–$C_9$ alkyl group.

Specific examples of the compounds represented by the general formula (III) include commercially available compounds such as ARONIX M-101 (n=about 2, $R^1$=H), ARONIX M-102 (n=about 4, $R^1$=H), ARONIX M-111 (n=about 1, $R^1$=n-$C_9H_{19}$), ARONIX M-113 (n=about 4, $R^1$=n-$C_8H_{19}$), and ARONIX M-114 (n=about 8, $R^1$=n-$C_9H_{19}$), ARONIX M-117 (n=2.5, $R^1$=n-$C_9H_{19}$), produced by TOA GOSEI KAGAKU KOGYO CO., LTD.; KAYARAD R-564 (n=about 2.3, R1=H), produced by NIPPON KAYAKU CO., LTD.; etc.

Also, there can be used compounds having an ethylenically unsaturated double bond other than those represented by the general formula (III), for example, commercially available compounds such as KAYARAD TC-110S and KAYARAD TC-120S, produced by NIPPON KAYAKU CO., LTD.; V-158 and V-2311, produced by OSAKA YUKI KAGAKU KOGYO CO., LTD.; etc.

Furthermore, unsaturated carboxylic acid diesters such as dimethyl maleate, diethyl maleate, and the like can also be used as the polymerizable compound (B).

(2) Compounds having two or more ethylenically unsaturated double bonds:

As the compound having two or more ethylenically unsaturated double bonds, there can be cited those compounds represented by general formulae (IV) to (X) below:

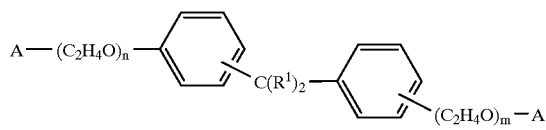
(IV)

wherein A is an acryloxy group ($CH_2$=CHCOO—) or a methacryloxy group ($CH_2$=C($CH_3$)COO—); $R^1$ is a hydrogen atom or a methyl group; and m and n are zero or an inter of 1 to 8.

(V)

wherein A is an acryloxy group ($CH_2$=CHCOO—) or a methacryloxy group ($CH_2$=C($CH_3$)COO—); and $R^2$ is a group consisting of 1 to 10 recurring units selected from $C_2$–$C_8$ groups of an oxyalkylene group, an oligooxyalkylene group, an ethylene glycol radical and/or a propylene glycol radical.

(V)

wherein A is an acryloxy group ($CH_2$=CHCOO—) or a methacryloxy group ($CH_2$=C($CH_3$)COO—); M is a diol radical; N is a dibasic acid radical; and n is 0 or 1.

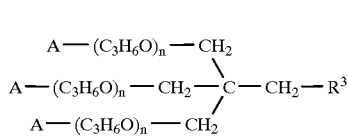
(VII)

wherein A is an acryloxy group ($CH_2$=CHCOO—) or a methacryloxy group ($CH_2$=C($CH_3$)COO—); $R^3$ is a hydrogen atom, a hydroxyl group or a methyl group; and n is 0 or an integer of 1 to 8.

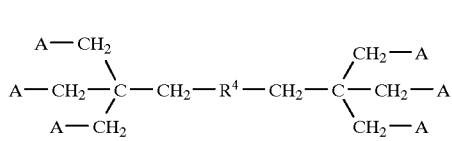
(VIII)

wherein A is an acryloxy group ($CH_2$=CHCOO—) or a methacryloxy group ($CH_2$=C($CH_3$)COO—); and $R^4$ is an oxygen atom or a methylene group.

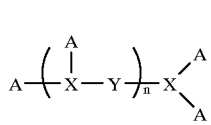
(IX)

wherein A is an acryloxy group ($CH_2$=CHCOO—) or a methacryloxy group ($CH_2$=C($CH_3$)COO—); X's, which may be the same or different, are a triol radial or polyol radical; Y's, which may be the same or different, are a dibasic or more acid radical; and n is 0 or an integer of 1 to 15.

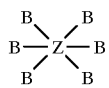
(X)

wherein B is an acryloxy group ($CH_2$=CHCOO—), a methacryloxy group ($CH_2$=C($CH_3$)COO—), a group of formula $CH_2$=CHCO[O($CH_2$)$_5$]$_m$CO— (where m is an integer of 1 to 4) or $CH_2$=C($CH_3$)CO[O($CH_2$)$_5$]$_m$CO— (where m is an integer of 1 to 4), and among total 6 B's, a is an acryloxy group ($CH_2$=CHCOO—) or a methacryloxy group ($CH_2$=C($CH_3$)COO—) and b is a group of formula $CH_2$=CHCO[O($CH_2$)$_5$]$_m$CO— (where m is an integer of 1 to 4) or $CH_2$=C($CH_3$)CO[O($CH_2$)$_5$]$_m$CO— (where m is an integer of 1 to 4), with a being an integer of 2 to 6, b being 0 or an integer of 1 to 4, and a+b=6; and Z is a 6-valent organic group or a group represented by formula (X) below:

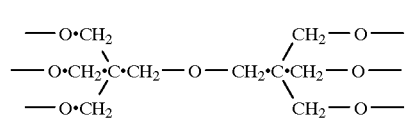
(XI)

Among the polyvalent (meth)acrylates described above, preferred are those compounds having two ethylenically unsaturated double bonds and those compounds having 3 or more ethylenically unsaturated double bonds. Particularly preferred are those compounds represented by the general formulae (VI), (VII) and (IX).

Specific examples of the compounds represented by the general formula (IV) above include, for example, commercially available compounds such as ARONIX M-210 ($R^2$=—(CH$_2$CH$_2$O)$_n$—, n=about 4), ARONIX M-245 ($R^2$=—(CH$_2$CH$_2$O)$_n$—, n=about 9), produced by TOA GOSEI KAGAKU KOGYO CO., LTD.; KAYARAD R-551 (n+m=about 4, A=a methacryloxy group), KAYARAD R-712 (n+m=about 4, A=a methacryloxy group), produced by NIPPON KAYAKU CO., LTD.; etc.

Specific examples of the compounds represented by the general formula (V) above include, for example, commercially available compounds such as ARONIX M-240 ($R^2$=CH$_2$CH$_2$O)$_n$—, n=about 4), ARONIX M-245 ($R^2$=CH$_2$CH$_2$O)$_n$—, n=about 9), from TOA GOSEI KAGAKU KOGYO CO., LTD.; KAYARAD HDDA ($R^2$=—(CH$_2$CH$_2$CH$_2$CH$_2$CH$_2$O)—), KAYARAD NPGDA ($R^2$=—(CH$_2$C(CH$_3$)$_2$CH$_2$O)—), KAYARAD TPDGA ($R^2$=—(CH$_2$CH(CH$_3$)O)—), KAYARAD PEG400DA ($R^2$=—(CH$_2$CH$_2$O)$_n$—, n=about 8), KAYARAD MANDA ($R^2$=—(CH$_2$C(CH$_3$)$_2$CH$_2$O)—), KAYARAD HX-220 ($R^2$=—(CH$_2$CH$_2$CH$_2$CH$_2$O)$_m$—CH$_2$—C(CH$_3$)$_2$COOCH$_2$C(CH$_3$)$_2$CH$_2$O(COCH$_2$CH$_2$CH$_2$CH$_2$CH$_2$O)$_n$—, m+n=2), and KAYARAD HX-620 ($R^2$=—(CH$_2$CH$_2$CH$_2$CH$_2$CH$_2$O)$_m$—CH$_2$—C(CH$_3$)$_2$COOCH$_2$C(CH$_3$)$_2$CH$_2$O(COCH$_2$CH$_2$CH$_2$CH$_2$CH$_2$O)$_n$—, m+n=4), from NIPPON KAYAKU CO., LTD.; etc.

Specific examples of the compounds represented by the general formula (VI) include, for example, oligoester acrylates, e.g., commercially available compounds such as ARONIX M-6100, ARONIX M-6200, ARONIX M-6250, ARONIX M-6300, ARONIX M-6400, and ARONIX M-6500, produced by TOA GOSEI KAGAKU KOGYO CO., LTD., and the like.

Examples of the compounds having two ethylenically unsaturated double bonds other than those compounds represented by the general formulae (IV), (V) and (VI), respectively, include, for example, commercially available compounds such as R-604 (NIPPON KAYAKU CO., LTD.); V260, V312, and V335HP (OSAKA YUKI KAGAKU KOGYO CO., LTD.); and the like.

Specific examples of the compounds represented by the general formula (VII) include, for example, commercially available compounds such as ARONIX M-309 (n=0, $R^3$=OH), and ARONIX M-310 (n=about 1, $R^3$=CH$_3$), produced by TOA GOSEI KAGAKU KOGYO CO., LTD.; KAYARAD TMPTA (n=0, $R^3$=CH$_3$), produced by NIPPON KAYAKU CO., LTD.; V-295 (n=0, $R^3$=CH$_3$), and V-300 (n=0, $R^3$=OH), produced by OSAKA YUKI KAGAKU KOGYO CO., LTD.; and the like.

Specific examples of the compounds represented by the general formula (VIII) include, for example, commercially available compounds such as ARONIX M-400, produced by TOA GOSEI KAGAKU KOGYO CO., LTD., and the like.

Specific examples of the compounds represented by the general formula (IX) include, for example, commercially available compounds such as ARONIX M-7100, ARONIX M-8030, ARONIX M-8060, ARONIX M-8100, and ARONIX M-9050, produced by TOA GOSEI KAGAKU KOGYO CO., LTD., and the like.

Specific examples of the compounds represented by the general formula (X) include, for example, commercially available compounds such as KAYARAD DPCA-20 (Z is the same as described in the formula (XI), m on average 1, a=on average 2, b=on average 4), KAYARAD DPCA-30 (Z is the same as described in the formula (XI), m=on average 1, a=on average 3, b=on average 3), KAYARAD DPCA-60 (Z is the same as described in the formula (XI), m=on average 1, a=on average 6, b=on average 0), and KAYARAD DPCA-120 (Z is the same as described in the formula (XI), m=on average 2, a=on average 6, b=on average 0), produced by NIPPON KAYAKU CO., LTD.; V-360, V-GPT, V-3PA, and V-400, produced by OSAKA YUKI KAGAKU KOGYO CO., LTD.; and the like.

Among the above-described commercially available compounds, preferred are those compounds represented by the general formula (IX), with ARONIX M-8060 being particularly preferred.

The polymerizable compounds (B) may be used singly or two or more of them may be used in combination. The polymerizable compounds (B) may be used in amounts of preferably 30 to 150 parts by weight, more preferably 50 to 100 parts by weight, per 100 parts by weight of the copolymer (A). When the polymerizable compound (B) is in amounts below 30 parts by weight per 100 parts by weight of the copolymer (A), sensitivity of the resulting composition upon exposure tends to decrease while with above 150 parts by weight of the polymerizable compound (B) per 100 parts by weight of the copolymer (A), compatibility of the polymerizable compound (B) with the copolymer (A) becomes poor so that the surface of the coating is coarsened upon film formation.

Radiation Sensitive Radical Initiator (C)

As the radiation sensitive radical initiator (C), there can be any conventional photo radical initiator can be used as far as that can polymerize the polymerizable compound (B) contained in the radiation sensitive resin composition of the present invention.

As the radiation sensitive radical initiator, there can be cited, for example, α-diketones such as benzyl, diacetyl, and the like; acyloins such as benzoin and the like; acyloin ethers such as benzoin methyl ether, benzoin ethyl ether, benzoin isopropyl ether, and the like; benzophenones such as thioxanthone, 2,4-diethylthioxanthone, thioxanthone-4-sulfonic acid, benzophenone, 4,4'-bis(dimethylamino)benzophenone, 4,4'-bis(diethylamino)benzophenone, and the like; acetophenones such as acetophenone, p-dimethylaminoacetophenone, α,α'-dimethoxyacetoxybenzophenone, 2,2'-dimethoxy-2-phenylacetophenone, p-methoxyacetophenone, 2-methyl[4-(methylthio)phenyl]-2-morpholino-1-propanone, 2-benzyl-2-dimethylamino-1-(4-morpholinophenyl)butan-1-one, and the like; quinones such as anthraquinone, 1,4-naphthoquinone, and the like; halogenide compounds such as phenacyl chloride, tribromomethylphenylsulfone, tris(trichloromethyl)-s-triazine, and the like; peroxides such as di-tert-butyl peroxide and the like; acylphosphine oxides such as 2,4,6-trimethylbenzoyldiphenylphosphine oxide and the like; etc.

Commercially available compounds of the radiation sensitive radical initiator (C) include IRGACURE 184, 651, 500 and 907, CGI369, and CG24-61, produced by CIBA GEIGY AG; LUCILIN LR8728, TPO, produced by BASF AG; DUROCURE 1116 and 1173, produced by MERCK CO.; UBECURIL p36, produced by UCB CO.; etc.

Among the various radiation sensitive radical initiators, preferred are acetophenones such as 2-methyl[4-(methylthio)phenyl]-2-morpholino-1-propanone and 2-benzyl-2-dimethylamino-1-(4-morpholinophenyl)butan-1-one, or phenacyl chloride, tribromomethylphenylsulfone, 2,4,6-trimethylbenzoyldiphenylphosphine oxide, and the like.

These compounds can be used singly or two or more of them can be used in combination.

The radiation sensitive radical initiator (C) can be used in amounts of preferably 1 to 50 parts by weight, more preferably 10 to 40 parts by weight, per 100 parts by weight of the copolymer (A). When the amount of the radiation sensitive radical initiator (C) is below 1 part by weight per 100 parts by weight of the copolymer (A), the resulting resin composition tends to suffer adverse influences (a decrease in sensitivity) due to deactivation of the radicals with oxygen. On the contrary, with above 50 part by weight of the initiator (C) per 100 parts by weight of the copolymer (A), the compatibility of the initiator (C) with the copolymer (A) tends to decrease or the resulting composition tends to have a decreased storage stability.

The radiation sensitive radical initiator (C) may be used in combination with a radiation sensitizer.

Various Additives:

In the present invention, in addition to the above-described copolymer (A), polymerizable compound (B), and radiation sensitive radical initiator (C), there can be added various additives described hereinbelow, if desired.

(1) Epoxy Compounds:

To the radiation sensitive resin composition can be added epoxy compounds in order to increase thermal resistance, hardness and the like of the composition.

The epoxy compound is not limited particularly unless compatibility is affected adversely. Preferably, there can be cited, for example, bisphenol A type epoxy resins, phenol novolak type epoxy resins, cresol novolak type epoxy resins, cyclic aliphatic epoxy resins, glycidyl ester type epoxy resins, glycidylamine type epoxy resins, heterocyclic epoxy resins, polyglycidyl methacrylates, and the like.

Among these, particularly preferred are bisphenol A type epoxy resins, cresol novolak type epoxy resins, glycidyl ester type epoxy resins, and the like.

The epoxy compounds can be used in amounts of preferably no larger than 100 parts by weight per 100 parts by weight of the copolymer (A).

(2) Thermal Polymerization Inhibitors:

In order to prevent a decrease in developability due to exposure to heat upon prebaking, thermal polymerization inhibitors can be added to the radiation sensitive resin composition of the present invention.

As the thermal polymerization inhibitor, there can be cited, for example, pyrogallol, benzoquinone, hydroquinone, Methylene Blue, tert-butylcathecol, monobenzyl ether, methyl hydroquinone, amylquinone, amyloxyhydroquinone, n-butylphenol, phenol, hydroquinone monopropyl ether, 4,4'-{1-[4-(1-(4-hydroxyphenyl) methylethyl)phenyl]ethylidene}diphenol, 1,1,3-tris(2,5-dimethyl-4-hydroxyphenyl)-3-phenylpropane, and the like.

These compounds can be used in amounts of preferably no larger than 5 parts by weight per 100 parts by weight of the copolymer (A).

(3) Surfactant:

In order to increase coatability, defoamability, leveling properties, and the like, surfactants can be added to the radiation sensitive resin composition of the present invention.

AS the surfactant, there can be used fluorine-containing surfactants commercially available under trade names BM-1000 and BM-1100, produced by BM CHEMIE AG; MEGAFAC F142D, MEGAFAC F172, MEGAFAC F173, and MEGAFAC F183, produced by DAI NIPPON INK AND CHEMICALS INDUSTRIES CO., LTD.; FLUORADE FC-135, FLUORADE FC-170C, FLUORADE FC-430, and FLUORADE FC-431, produced by SUMITOMO 3M CO., LTD.; SURFLON S-112, SURFLON S-113, SURFLON S-131, SURFLON S-141, and SURFLON S-145, produced by ASAHI GLASS CO., LTD.; SH-28PA, SH-190, SH-193, SZ-6032, SF-8428, produced by TORAY SILICONE CO., LTD.; etc.

These surfactants can be used in amounts of preferably no larger than 5 parts by weight per 100 parts by weight of the copolymer (A).

(4) Adhesion Promoters:

In order to increase adhesion strength to substrates, adhesion promoters can be added to the radiation sensitive resin composition of the present invention.

As the adhesion promoter, functional silane coupling agents are effective.

Here, by the term "functional silane coupling agent" is meant a silane coupling agent having one or more of reactive substituent groups such as a carboxyl group, a methacryloyl group, an isocyanate group, and an epoxy group. Specific examples of such a functional silane coupling agent include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane, and the like.

The functional silane coupling agents can be blended in amounts of preferably no larger than 20 parts by weight per 100 parts by weight of the copolymer (A).

(5) Other Additives:

In order to precisely adjust the solubility of the composition in alkali developers, carboxylic acids can be added to the radiation sensitive resin composition of the present invention.

Specific examples of the carboxylic acid compound include, for example, monocarboxylic acids such as acetic acid, propionic acid, n-butyric acid, iso-butyric acid, n-valeric acid, iso-valeric acid, benzoic acid, cinnamic acid, and the like; hydroxymonocarboxylic acids such as lactic acid, 2- hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, syringinic acid, and the like; polybasic carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid, 1,2,5,8-naphthalenetetracarboxylic acid, and the like; acid anhydrides such as itaconic anhydride, succinic anhydride, citraconic anhydride, dodecenylsuccinic anhydride, tricarbanylic anhydride, maleic anhydride, hexahydrophthalic anhydride, methyltetrahydrophthalic anhydride, hymic anhydride, 1,2,3,4-butanetetracarboxylic anhydride, cyclopentanetetracarboxylic anhydride, phthalic anhydride, pyromellitic anhydride, trimellitic anhydride, benzophenonetetracarboxylic anhydride, ethylene glycol bis (trimellitic anhydride), glycerol tris(trimellitic anhydride), and the like.

Further, to the resin composition of the present invention, can be added fillers, coloring agents, viscosity modifiers, and the like, if desired.

As the fillers, there can be used, for example, silica, alumina, talc, bentonite, zirconium silicate, powder glass, and the like.

As the coloring agents, there can be cited, for example, extender pigments, such as alumina white, clay, barium carbonate, barium sulfate, and the like; inorganic pigments such as zinc oxide (Chinese white), white lead (particularly basic lead carbonate), chrome yellow pigment, red lead oxide, ultramarine blue pigment, titanium oxide, zinc chromate, blood red (red oxide), carbon black, and the like; organic pigments such as Brilliant Carmine 6B, Permanent Red 6B, Permanent Red R, Benzidine Yellow, Phthalocyanine Blue, Phthalocyanine Green, and the like; basic dyes such as magenta, rhodamine, and the like; direct dyes such as Direct Scarlet, Direct Orange, and the like; acid dyes such as Roselin, Metal Yellow, and the like; etc.

As the viscosity modifier, there can be cited, for example, bentonite, silica gel, aluminum powder, and the like.

These additives can be added to the resin composition in amounts which do not harm its fundamental characteristics, preferably no larger than 50% by weight based on the total weight of the resulting resin composition.

The radiation sensitive resin composition of the present invention can be prepared by mixing and stirring the component ingredients by a conventional manner when it contains no filler or pigment. When fillers and/or pigments are added, the resin composition may be prepared by mixing and dispersing the component ingredients using a disperser such as a dissolver, homogenizer, 3-roll mill or the like. If desired, the resulting mixture may be filtered with a mesh, membrane filter or the like.

Solvents:

In the present invention, organic solvents may be used to dilute the above-described copolymer (A), polymerizable compound (B), radiation sensitive radical initiator (C), and various additives optionally added, if desired, so that these components can be mixed with each other uniformly.

As the solvent, any types of solvent may be used as far as they can dissolve the copolymer (A) and other components uniformly but do not react with each component.

As the solvent, there can be used the same solvents as the polymerization solvents used in the preparation of the copolymer (A). Further, there can be added high boiling solvents such as N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, capric acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenylcellosolve acetate, and the like.

Among these solvents, preferred are alkyl ethers of polyols such as ethylene glycol monoethyl ether, diethylene glycol monomethyl ether, and the like; alkyl ether acetates of polyols such as ethyl cellosolve acetate and the like; esters such as ethyl 3-methoxypropionate, methyl 3-methoxypropionate, ethyl 2-hydroxypropionate, and the like; ketones such as diacetone alcohol and the like; etc., in view of solubility, reactivity with each component, and film forming ability.

The amount of the above-described solvents can be determined appropriately depending upon various factors including the utility and manner of coating, and the like.

[Method of Forming Bumps]

1. Formation of Coating:

In the present invention, the above-described solution of the resin composition is coated on a substrate having a desired wiring pattern, and the solvent is removed, if desired, by heating and drying to form a coating having a desired thickness.

The method of applying the solution of the resin composition onto the substrate to be treated includes a spin coating method, a roll coating method, a screen printing method, an applicator coating method, and the like.

The conditions under which the coating of the resin composition of the present invention is dried may vary depending upon the kinds and blending proportions of the components contained in the composition, thickness of the coating, and the like and usually, 70 to 120° C. for about 5 to 20 minutes, preferably 80 to 100° C.

When the period of time of drying is too short, the coating adheres to the substrate poorly upon development while it is too long, a decrease in resolution occurs due to exposure to heat.

2. Irradiation of Radiation:

The resulting coating can be exposed to ultraviolet rays or visible light with wavelengths of 300 to 500 nm through a mask having a predetermined mask so that only the portion of the wiring pattern where bumps are to be formed can be photocured.

As a source of such a radiation can be used a low pressure mercury lamp, a high pressure mercury lamp, super high pressure mercury lamp, a metal halide lamp, an argon gas laser, and the like. Here, by the term "radiation" is meant ultraviolet rays, visible light, far ultraviolet rays, X-rays, electron rays, and the like.

The dose of the radiation may vary depending on the kinds and blending proportions of the components in the composition, the thickness of the resulting coating, and the like and usually, for example, 100 to 500 mJ/cm$^2$ in the case where a super high pressure mercury lamp is used.

3. Development:

After the irradiation of the radiation, the resin composition of the present invention can be developed with an aqueous alkaline solution as a developer to dissolve and remove unnecessary portion so that only the exposed portion can remain.

As the developer, aqueous solutions of alkalis such as sodium hydroxide, potassium hydroxide, sodium carbonate, sodium silicate, sodium metasilicate, ammoniacal water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene, 1,5-diazabicyclo-[4,3,0]-5-nonene, and the like.

Also, there may be used, as the developer, mixed aqueous solutions containing the above aqueous solution of alkalis and suitable amounts of water-soluble or miscible organic solvents such as methanol, ethanol, and the like, and surfactants.

Developing time may vary depending on the kinds and blending proportions of the components in the resin composition, the dry thickness of the resin composition and usually 30 to 360 seconds. The resin composition may be developed by any of a dipping method, a paddling method, a spraying method, and the like.

After the development, the developed coating was washed with tap water and dried using an air gun or the like or in an oven.

4. Post-treatment:

The radiation sensitive resin composition of the present invention can be cured sufficiently only with the irradiation of radiation described above. However, a further curing may be performed by additional irradiation of radiation (hereafter, referred to as "post-exposure") or heating depending on the utility.

The post-exposure can be performed in the same manner as the irradiation of radiation described above and the dose thereof is not limited particularly. However, it is preferred to use a dose of 100 to 1,000 mJ/cm$^2$ in the case where a high pressure mercury lamp is used.

When heating is performed, it is sufficient to heat the developed resin composition using a heater such as a hot plate, an oven, and the like at a predetermined temperature, for example, 100 to 200° C. for a predetermined period of time, for example, 5 to 60 minutes on a hot plate, or 30 to 90 minutes in an oven.

The post-treatment can give rise to patterned cured product having further improved characteristics.

5. Plating:

The substrates after the post-exposure treatment described above can be plated by dipping them in various plating liquids for electric plating and performing plating at appropriate current values and current application times.

6. Peeling:

The cured product derived from the radiation sensitive resin composition of the present invention can be peeled from the plated substrates by dipping the substrates in a peeling liquid stirred at 50 to 80° C. for 5 to 30 minutes.

As the peeling liquid, there can be used an aqueous mixed solution of a quaternary ammonium salt, water and dimethyl sulfoxide.

EXAMPLES

Hereafter, the present invention will be described in a greater detail by examples. However, the present invention should not be considered as being limited thereto. All parts and percentages (%) herein are by weights unless otherwise indicated specifically.

Preparation of Copolymer (A)

(1) Preparation Example 1

After it was purged with nitrogen, a flask equipped with a dry ice/methanol reflux condenser was charged with 2,2'-azobisisobutyronitrile (4 g) as a polymerization initiator, and diethylene glycol dimethyl ether (100 g) and diethylene glycol monomethyl ether (50 g) as a solvent. The resulting mixture was stirred until the polymerization initiator was dissolved.

Subsequently, there were charged methacrylic acid (20 g), 2-hexahydrophthaloyloxyethyl methacrylate (15 g), dicyclopentanyl methacrylate (45 g), styrene (15 g), and 1,3-butadiene (5 g) as a polymerizable compound constituting the copolymer (A), followed by gently stirring the resulting mixture.

Thereafter, the temperature of the solution was elevated to 80° C., at which temperature polymerization was allowed to proceed for 4 hours.

Then, the reaction mixture was added dropwise in a large amount of methanol to coagulate the copolymer.

After washing it with water, the copolymer thus obtained was redissolved in the equivalent weight of tetrahydrofuran and coagulated again with a large amount of methanol.

This redissolving and coagulation cycle was repeated three times and thereafter the resulting copolymer was dried under reduced pressure at 40° C. for 48 hours to give target copolymer (1).

(2) Preparation Example 2

The procedure described in Preparation Example 1 was repeated except for using 2,2'-azobis-2,4-dimethylvaleronitrile (4 g) as the polymerization initiator, diethylene glycol diethyl ether (100 g), and ethyl 2-hydroxypropionate (150 g) as the solvent, and methacrylic acid (25 g), 2-hexahydrphthaloyloxyethyl methacrylate (10 g), dicyclopentanyl methacrylate (50 g), styrene (10 g), and 1,3-butadiene (5 g) as the polymerizable compound constituting copolymer (A) to yield target copolymer (2).

(3) Preparation Example 3

The procedure described in Preparation Example 1 was repeated except for using 2,2'-azobisisobutyronitrile (4 g) as the polymerization initiator, diacetone alcohol (150 g) as the solvent, acrylic acid (15 g), 2-hexahydrophthaloyloxyethyl methacrylate (25 g), dicyclopentanyl methacrylate (40 g), styrene (10 g) and 1,3-butadiene (10 g) as the polymerizable compound constituting the copolymer (A) to yield target copolymer (3).

(4) Preparation Example 4

The procedure described in Preparation Example 1 was repeated except for using 2,2'-azobis-2,4-dimethylvaleronitrile (4 g) as the polymerization initiator, ethyl 3-ethoxypropionate (150 g) as the solvent, methacrylic acid (30 g), 2-hexahydrophthaloyloxyethyl methacrylate (10 g), dicyclopentanyl methacrylate (40 g), styrene (10 g) and 1,3-butadiene (10 g) as the polymerizable compound constituting the copolymer (A) to yield target copolymer (4).

(5) Preparation Example 5

The procedure described in Preparation Example 1 was repeated except for using 2,2$^1$-azobisisobutyronitrile (4 g) as the polymerization initiator, methyl 3-methoxypropionate (150 g) as the solvent, methacrylic acid (25 g), 2-hexahydrophthaloyloxyethyl methacrylate (7.5 g), dicyclopentanyl methacrylate (47.5 g), styrene (10 g) and 1,3-butadiene (10 g) as the polymerizable compound constituting the copolymer (A) to yield target copolymer (5).

(6) Preparation Example 6

The procedure described in Preparation Example 1 was repeated except for using 2,2'-azobisisobutyronitrile (4 g) as the polymerization initiator, methyl 3-methoxypropionate (150 g) as the solvent, methacrylic acid (20 g), 2-hexahydrophthaloyloxyethyl methacrylate (15 g), dicyclopentanyl methacrylate (45 g), n-butyl acrylate (12 g) and isoprene (8 g) as the polymerizable compound constituting the copolymer (A) to yield target copolymer (6).

(7) Preparation Example 7

The procedure described in Preparation Example 1 was repeated except for using 2,2'-azobisisobutyronitrile (4 g) as the polymerization initiator, 2-ethoxyethyl acetate (150 g) as the solvent, methacrylic acid (25 g), dicyclopentanyl methacrylate (40 g), n-butyl acrylate (25 g), and isoprene (10 g) as the polymerizable compound constituting the copolymer (A) to yield target copolymer (7).

(8) Preparation Example 8

The procedure described in Preparation Example 1 was repeated except for using 2,2'-azobisisobutyronitrile (4 g) as the polymerization initiator, methyl 3-methoxypropionate (150 g) as the solvent, methacrylic acid (25 g), methoxytriethylene glycol acrylate (20 g), dicyclopentanyl methacrylate (40 g), n-butyl acrylate (10 g), and isoprene (5 g) as the polymerizable compound constituting the copolymer (A) to yield target copolymer (8).

(9) Preparation Example 9

The procedure described in Preparation Example 1 was repeated except for using 2,2'-azobisisobutyronitrile (4 g) as the polymerization initiator, ethyl 2-hydroxypropionate (150 g) as the solvent, methacrylic acid (25 g), methoxydipropylene glycol acrylate (10 g), dicyclopentanyl methacrylate (40 g), n-butyl acrylate (20 g), and 1,3-butadiene (5 g) as the polymerizable compound constituting the copolymer (A) to yield target copolymer (9).

(10) Preparation Example 10

The procedure described in Preparation Example 1 was repeated except for using 2,2'-azobisisobutyronitrile (4 g) as the polymerization initiator, ethyl 3-ethoxypropionate (150 g) as the solvent, methacrylic acid (20 g), methoxydipropylene glycol acrylate (35 g), dicyclopentanyl methacrylate (42 g), and isoprene (3 g) as the polymerizable compound constituting the copolymer (A) to yield target copolymer (10).

(11) Preparation Example 11 (Comparison)

The procedure described in Preparation Example 1 was repeated except for using 2,2'-azobisisobutyronitrile (4 g) as the polymerization initiator, methyl 3-methoxypropionate (150 g) as the solvent, methacrylic acid (20 g), 2-hexahydrophthaloyloxyethyl methacrylate (15 g), styrene (50 g), and 1,3-butadiene (15 g) as the polymerizable compound constituting the copolymer (A) to yield comparison copolymer (11).

Example 1

(1) Preparation of a composition

Copolymer (1) (10 g) obtained in Preparation Example (1) above was dissolved in methyl 3-methoxypropionate (10 g). In the solution were dissolved 2,4,6-trimethylbenzoyldiphenylphosphone oxide (LUCILIN TPO, trade name for a product by BASF AG) (2 g) and IRGACURE 651 (trade name for a product by CIBA GEIGY AG) (1 g) as radiation sensitive radical initiator (c), ARONIX M8060 (trade name for a product by TOA GOSEI KAGAKU KOGYO CO., LTD.) (4 g) as copolymerizable compound (B), γ-glycidoxypropyltrimethoxysilane (0.05 g) as an adhesion promoter, BM-1000 (trade name for a product by BM CHEMIE AG) (0.03 g) as a surfactant, and 1,1,3-tris(2,5-dimethyl-4-hydroxyphenyl)-3-phenylpropane (0.2 g) as a thermal polymerization inhibitor. The resulting solution was kneaded with a 3-roll mill to obtain a solution having a uniform composition.

Table 1 shows the contents of the components (A), (B), and (C).

(2) Evaluation of Characteristics

1) Resolution

A test composition was coated on a nickel substrate using a spinner at 1000 rpm for 20 minutes and then the substrate was prebaked on a hot plate at 90° C. for 5 minutes to form a 55 μm thick coating film.

Next, the coated substrate was exposed to ultraviolet rays at 30 mJ/cm$^2$ from a high pressure mercury lamp (USH-25 OD, USHIO) through a pattern mask for measuring resolution.

The thus exposed substrate was developed with a 0.5% aqueous tetramethylammonium hydroxide solution.

Thereafter, the developed substrate was rinsed with tap water and blown with nitrogen gas to obtain a patterned cured product.

The product was observed on an optical microscope to determine resolution of the pattern.

Further, the yield of residual film thickness after development was measured. Here, by the term "yield of residual film thickness" is meant a value obtained by dividing the thickness of a film after development by the thickness of the film after prebaking and multiplying the quotient with 100. Table 2 shows the results obtained.

2) Resistance to plating liquids

The substrate having thereon the patterned cured product obtained in 1) above was heated at 100° C. for 5 minutes on a hot plate to obtain a test specimen.

Then, the test specimen was dipped in a plating liquid at 60° C. for 60 minutes, rinsed in tap water to obtain a treated test specimen. The plating liquid used included MICROFAB Au 100 (TANAKA NOBLE METAL CO., LTD.) (hereafter, referred to as "plating liquid A") and SOLDERON NF (NIPPON LINAROL CO., LTD.) (hereafter, referred to as "plating liquid B").

The treated test specimen was observed on a scanning electron microscope to observe the condition of the patterned cured product on the substrate so that resistance to plating liquids could be evaluated. Table 2 shows the results obtained.

In Table 2, symbol "O" indicates that the condition of the patterned cured product was fair while symbol "X" indicates that cracks appeared in the patterned cured product.

3) Plating ability

A 55 μm thick coating film was formed on a nickel substrate in the same manner as in 1) above.

Then, the substrate was exposed to 300 mJ/cm$^2$ ultraviolet rays from super high pressure mercury lamp (USH-250D, produced by USHIO) through a mask having a pattern of voids of square or circle in shape of 50 to 100 μm long or in diameter arranged at a pitch of 10 μm.

The thus exposed substrate was developed and rinsed in the same manner as in 1) above to obtain a patterned cured product, which was then heated on a hot plate at 100° C. for 5 minutes to obtain a test specimen.

Plating of the test specimen was conducted with plating liquids A or B at a current of 1 to 10 A/100 cm$^2$ at room temperature for 40 minutes. After completion of the plating, the patterned cured product was evaluated for its wettability to the plating liquids and adhesion strength with the substrate. Table 2 shows the results obtained.

Evaluation of wettability to plating liquids was expressed by symbol "O" which indicates that uniform plating occurred and symbol "X" which indicates that non-uniform plating occurred. Evaluation of adhesion strength was expressed by symbol "O" which indicates that no plating liquid entered in between the patterned cured product and the substrate and symbol "IX" which indicates that some plating liquid entered in between the patterned cured product and the substrate.

4) Peelability

To peel the patterned cured product from the plated test specimen obtained in 3) above, the test specimen was dipped in a peeling liquid, i.e., a 0.5 wt.% tetramethylammonium hydroxide solution in dimethyl sulfoxide containing 1.5 wt.% water, for 5 minutes. A 50 μm×50 μm area of the plated portion formed on the substrate of the thus treated test specimen was observed on a scanning electron microscope. Table 2 shows the results obtained.

Symbol "O" indicates that no residue of the patterned cured product was noted while symbol "IX" indicates that some residue of the patterned cured product was noted.

5) Resistance to cracking upon bending

A resist was coated on a 50 μm thick polyimide film and baked in an oven at 100° C. for 20 minutes. The resist-coated polyimide film obtained was rolled up on a glass rod of 60 mm, 30 mm or 10 mm in diameter, and visual observation of the film was made to see if any cracking occurred. Table 2 shows the results obtained.

Symbol "O" indicates that no cracking occurred while symbol "IX" indicates cracking occurred.

Examples 2 to 9 and Comparative Examples 1 to 3

Compositions of Examples 2 to 9 and Comparative Examples 1 to 3 were prepared in the same manner as in Example 1 except that the copolymer (A), photopolymerizable compound (B) and radiation sensitive radical initiator (C) shown in Table 1 were used.

The compositions obtained were evaluated for their characteristics in the same manner as in Example 1. Table 2 shows the results obtained.

Examples 10 to 12 and Comparative Examples 4 and 5

Resistance to cracking upon bending was evaluated using the compositions shown in Table 1. Table 3 shows the results obtained.

TABLE 1

|  |  | Copolymer (A) (Parts) |  | Copolymer (B) (Parts) |  | Radiation Sensitive Radical Initiator (C) LUCILIN TPO/IRGACURE 651 |
|---|---|---|---|---|---|---|
| Example | 1 | Copolymer (1) | 100 | M8060 | 40 | 20/10 |
|  | 2 | Copolymer (1) | 100 | M8060 | 50 | 20/10 |
|  | 3 | Copolymer (1) | 100 | M8060 | 60 | 20/10 |
|  | 4 | Copolymer (2) | 100 | M8060 | 50 | 15/15 |
|  | 5 | Copolymer (3) | 100 | M8060 | 50 | 10/20 |
|  | 6 | Copolymer (4) | 100 | M8060 | 50 | 5/25 |
|  | 7 | Copolymer (5) | 100 | M8060 | 50 | 10/5 |
|  | 8 | Copolymer (6) | 100 | M8060 | 50 | 20/10 |
|  | 9 | Copolymer (7) | 100 | M8060 | 50 | 20/10 |
|  | 10 | Copolymer (8) | 100 | M8060 | 50 | 20/10 |
|  | 11 | Copolymer (9) | 100 | M8060 | 50 | 20/10 |
|  | 12 | Copolymer (10) | 100 | M8060 | 50 | 20/10 |
| Comparative Example | 1,4 | Copolymer (1) | 100 | M8060 | 50 | 5/0 |
|  | 2 | Copolymer (1) | 100 | M8060 | 170 | 20/10 |
|  | 3.5 | Copolymer (6) | 100 | M8060 | 50 | 20/10 |

TABLE 2

|  |  | Resolution (μm) | Yield of Residual Film Thickness (%) | Plating Properties | | | Peelability |
|---|---|---|---|---|---|---|---|
|  |  |  |  | Resistance to Plating Liquids Plating Liquid A/ Plating Liquid B | Wettability to Plating Liquids Plating Liquid A/ Plating Liquid B | Adhesion to Substrate Plating Liquid A/ Plating Liquid B |  |
| Example | 1 | 20 | 96 | ○/○ | ○/○ | ○/○ | ○ |
|  | 2 | 22 | 94 | ○/○ | ○/○ | ○/○ | ○ |
|  | 3 | 30 | 94 | ○/○ | ○/○ | ○/○ | ○ |
|  | 4 | 27 | 90 | ○/○ | ○/○ | ○/○ | ○ |
|  | 5 | 25 | 96 | ○/○ | ○/○ | ○/○ | ○ |
|  | 6 | 20 | 90 | ○/○ | ○/○ | ○/○ | ○ |
|  | 7 | 22 | 92 | ○/○ | ○/○ | ○/○ | ○ |
|  | 8 | 25 | 94 | ○/○ | ○/○ | ○/○ | ○ |
|  | 9 | 24 | 92 | ○/○ | ○/○ | ○/○ | ○ |
| Comparative Example | 1 | 27 | 70 | X/X | ○/○ | X/X | — |
|  | 2 | 30 | 80 | X/○ | ○/○ | X/○ | X |
|  | 3 | 25 | 65 | X/X | X/X | X/X | — |

TABLE 3

|  |  | Resolution (μm) | Yield of Residual Film Thickness % | Resistance to Cracking *) Diameter of Glass Rod | | |
|---|---|---|---|---|---|---|
|  |  |  |  | 60 mm | 30 mm | 10 mm |
| Example | 10 |  | 94 | ○ | ○ | ○ |
|  | 11 |  | 94 | ○ | ○ | ○ |
|  | 12 |  | 94 | ○ | ○ | ○ |
| Comparative Example | 4 | 27 | 70 | ○ | X | X |
|  | 5 | 25 | 65 | ○ | X | X |

*) ○: No Cracking occurred
X: Cracking occurred

The present invention has been described in detail with respect to an embodiment, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A method for forming bumps on a substrate, comprising the steps of:
   (1) coating a radiation sensitive resin composition on a substrate having a desired wiring pattern, followed by drying to form a coating film;
   (2) irradiating said coating film with a radiation through a mask;
   (3) developing said coating film after the irradiation with the radiation with an alkali developer solution;
   (4) electroplating said substrate carrying said coating film after the development;
   (5) peeling the resulting cured product of the resin composition from said substrate after the electroplating, wherein said radiation sensitive resin composition [comprising] comprises:
      (A) an alkali-soluble copolymer comprising:
         (a) 10 to 50% by weight of a first unit consisting of a radical polymerizable compound having a carboxylic group,
         (b) 20 to 60% by weight of a second unit consisting of a radical polymerizable compound having a cycloalkyl group, said unit containing no carboxyl group, and
         (c) 5 to 40% by weight of a third unit consisting of a radical compound other than said radical polymerizable compounds in (a) and (b) above and comprising a conjugated diolefin;

(B) a polymerizable compound having at least one ethylenically unsaturated double bond; and (C) a radiation sensitive radical initiator.

2. The method as claimed in claim 1, further comprising the step of: (3') processing said coating film by irradiating a radiation or heating between the steps (3) and (4) above.

3. The method as claimed in claim 1, wherein said radical polymerizable compound (c) contains a compound selected from the group consisting of a compound represented by formula (I) below:

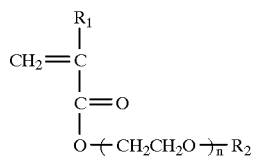
(I)

wherein $R_1$ is a hydrogen atom or a methyl group; $R_2$ is a hydrogen atom or a $C_1$–$C_4$ alkyl group; and n is an integer not smaller than 2 and not larger than 25 and a compound represented by formula (II) below:

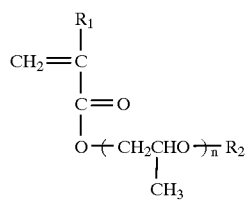
(II)

wherein $R_1$ is a hydrogen atom or a methyl group; $R_2$ is a hydrogen atom or a $C_1$–$C_4$ alkyl group; and n is an integer not smaller than 2 and not larger than 25.

4. The method as claimed in claim 1, wherein said radical polymerizable compound (b) is selected from the group consisting of cyclohexyl (meth)acrylate, 2-methylcyclohexyl (meth)acrylate, dicyclopentanyloxyethyl (meth)acrylate, and dicyclopentanyl (meth) acrylate.

* * * * *